United States Patent [19]

Cox

[11] 4,184,112
[45] Jan. 15, 1980

[54] CAPACITOR TESTING APPARATUS

[76] Inventor: Elbert W. Cox, P. O. Box 770, The Dalles, Oreg.

[21] Appl. No.: 883,142

[22] Filed: Mar. 3, 1978

[51] Int. Cl.² .......................................... G01R 27/26
[52] U.S. Cl. .................................... 324/60 C; 324/127
[58] Field of Search ............................. 324/60 C, 127

[56] References Cited
U.S. PATENT DOCUMENTS

| | | | |
|---|---|---|---|
| 1,906,466 | 5/1933 | Haskins | 324/60 C |
| 2,922,110 | 1/1960 | Miller | 324/127 X |
| 3,243,705 | 3/1966 | Chenoweth | 324/127 |
| 4,004,221 | 1/1977 | Wilson | 324/127 X |

*Primary Examiner*—Stanley T. Krawczewicz
*Attorney, Agent, or Firm*—Eugene D. Farley

[57] ABSTRACT

Capacitor testing apparatus comprises a plurality of individual coils of differing numbers of turns forming a toroid peritting use of a conventional tong-type alternating current ammeter to measure the alternating current flowing through a selected coil and the capacitor under test. The toroid is supported on and external to a box which contains the coil terminals and is made in a variety of shapes and sizes as the need demands. Mounted within the box is a switch associated wth each of the coils providing a plurality of electrical circuits between an alternating current power source and capacitor test leads to which the capacitor under test is connected. The capacity value of the capacitor is determined by energizing the capacitor through one of the circuits, noting the ammeter reading in amperes and multiplying the reading by the multiplier designating the selected coil's switch.

7 Claims, 4 Drawing Figures

U.S. Patent
Jan. 15, 1980
4,184,112
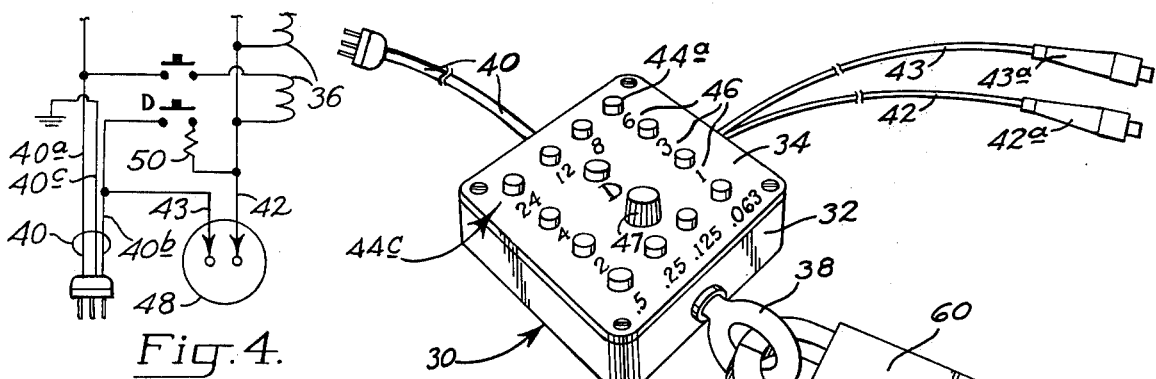
Fig. 4.
Fig. 1.
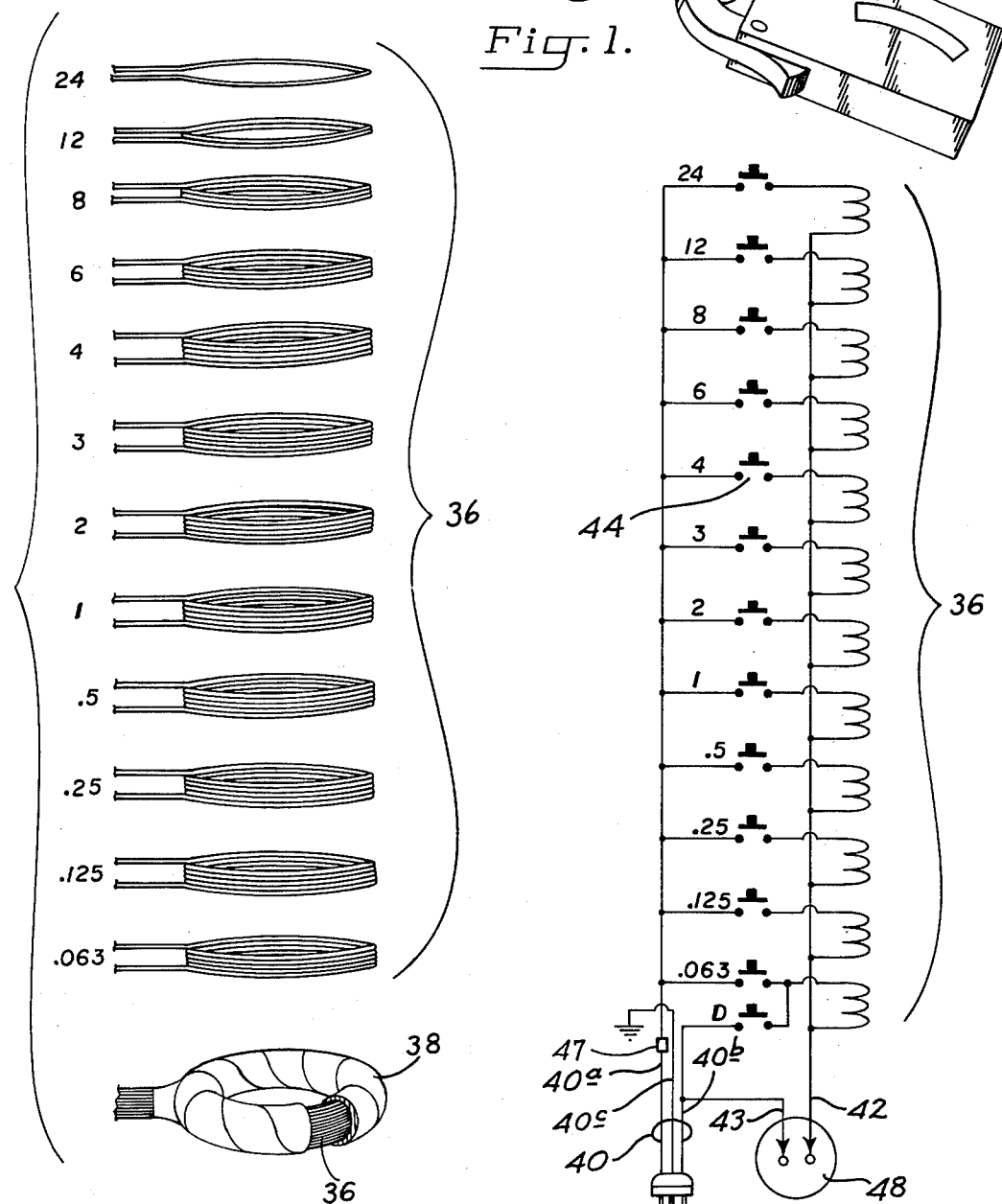
Fig. 2.
Fig. 3.

CAPACITOR TESTING APPARATUS

BACKGROUND AND GENERAL STATEMENT OF THE INVENTION

My invention pertains to apparatus for determination of the capacity value of capacitors used in commercial electrical equipment.

In the commercial electrical industry, capacitors are extensively used with alternating current power systems and alternating current motors. It is frequently necessary to verify and/or determine the capacity value of a capacitor prior to its installation and use.

Determination of capacitor value by measurement of alternating current flow through the capacitor follows basic electrical principles. The Williams U.S. Pat. No. 2,455,543 discloses application of a direct current that alternately charges and discharges the capacitor to obtain a current flow measurement. Sharland U.S. Pat. No. 2,135,017 and Marlow U.S. Pat. No. 3,320,527 disclose tapped coils to, in effect, produce a plurality of coils.

Available equipment for capacity determination is elaborate and complicated for use by the conventional electric shop. Capacitor testers employing electrical bridge circuits are delicate and require detailed knowledge to obtain acceptable results. Such equipment requires the use of electrical formulae in determination of the capacitor value.

It is the general objective of my invention to provide simple apparatus available to the electric shop that permits capacity value determination by use of normally available alternating current and a conventional tong-type alternating current ammeter by application of simple multiplication of the ammeter reading by a predetermined factor to determine the capacitor value.

Another object of this invention is to provide apparatus that is rugged in structure.

Another object of this invention is to provide apparatus that is simple in construction.

Another object of this invention is to provide apparatus that is readily transported to the point of use.

Another object of this invention is to provide apparatus that is low in initial cost.

Another object of this invention is to provide apparatus that is of long life.

Another object of this invention is to provide apparatus that will withstand electrical abuse.

Another object of this invention is to provide apparatus that is efficient and reliable.

Another object of this invention is to provide apparatus that is accurate within the limits normally required.

Another object of this invention is to provide apparatus that assures freedom from electric shock by the equipment being tested.

Broadly considered, the foregoing and other objects are accomplished by apparatus that comprises at least one, preferably a plurality of individual coils of differing numbers of turns, forming a toroid permitting insertion of the tongs of a conventional tong-type alternating current ammeter for measurement of current flow. Each coil provides an electrical circuit between a pair of power leads and a pair of test leads to which the capacitor being tested is electrically connected. Each circuit consists of a coil and a switch permitting selection of the coil through which current flows to energize the capacitor under test to obtain an ammeter reading related to the current flow through the selected coil. An independent switch provides momentary shorting of the test leads through a coil or a resistor to discharge the capacitor following the test. The switches and all electrical connections are contained within a box having the power cable and test leads extending therefrom and having the toroid mounted externally on the box to receive the ammeter tongs. Each switch is designated by the multiplier to be applied to the ammeter reading to obtain the micro-farad value of the capacitor under test.

DESCRIPTION OF THE DRAWINGS AND PREFERRED EMBODIMENTS OF THE INVENTION

FIG. 1 is a perspective view of the apparatus in association with a tong-type alternating current ammeter.

FIG. 2 is a fragmented perspective of the toroid and exploded view of the coils forming the toroid.

FIG. 3 is a schematic electrical diagram of the apparatus.

FIG. 4 is a partial schematic electrical diagram of the apparatus showing an alternate discharge circuit.

The apparatus of FIG. 1 comprises a box 30 having a receptacle 32 closed with a cover 34. Extending from and mounted on one side of the receptacle 32 is at least one, preferably a plurality of coils 36 FIG. 2 forming a toroid 38 through which the tongs of a conventional tong-type alternating current ammeter 60 are inserted. Extending from a second side of the receptacle 32 is a three-conductor power cable 40 and extending from a third side of the receptacle 32 are test leads 42 and 43 provided with test clips 42a and 43a. Mounted within the box 30 are normally open single-pole switches 44 FIG. 3, having actuating buttons 44a, FIG. 1. Each switch makes up to a common metal grounding plate either inside or outside the box cover 34 FIG. 1 and is identified by designations 46 either on the cover 34 or on the top of the actuating button 44A, FIG. 1, corresponding to the coils 36 identifications 0.063 through 24 and discharge "D", FIGS. 2 and 3.

The coils 36 FIGS. 2 and 3, forming toroid 38 each have a number of turns related to the multiplier to be applied to the ammeter reading for determination of capacity, as later described.

The electrical circuit, FIG. 3, comprises a circuit for each coil in common with the power cable 40 and test leads 42 and 43. Each circuit connects the power lead 40a through fuse 47, through a switch 44 through one of the coils 36 to the test lead 42 through the capacitor 48 under test to test lead 43 and return power lead 40b of the power cable 40.

Each of the switches 44 is designated by a number 46 relating to the coil with which it is associated, the number indicating the multiplier to be applied to the ammeter reading to obtain the capacity value of the capacitor 48 under test. The switch designated by the letter "D" FIGS. 1 and 3, electrically connects test leads 42 and 43 through one of the multiturn coils 36 to provide a current limiting discharge circuit for the capacitor 48 following test. An alternate capacitor discharge circuit shown in FIG. 4 employs a resistor 50 to limit the current when discharging the capacitor 48. A ground lead 40C is provided in the power cable 40 for grounding the metal support parts of the apparatus. The power source to which cable 40 is attached is a conventional 110–115 volt, single-phase alternating current receptacle.

OPERATING PRINCIPLE

The apparatus is based on the electrical laws that the current flow through a condenser from an alternating voltage supply is expressed by the formula $$I = E/X_c$$

where I represents ampere current, E voltage and $X_c$ impedance. The impedance $X_c$ is expressed by the formula $$X_c = 1/2\pi f C$$

where $X_c$ is in ohms, f is the frequency of the power supply in herts and C is the capacity in farads. Combining these formulae with the capacity C expressed in micro-farads results in the formula for capacity $$C = \frac{I \times 10^6}{2\pi f E}$$

The tong-type alternating current ammeter with the tongs inserted through the toroid reads directly current flow through one of the coils 36 when the coil being employed is a single loop. When the coil being employed is multi-turn, the reading of the ammeter divided by the number of turns in the coil being employed provides the actual current flow through the capacitor.

Substituting $I_m/N$ for I where $I_m$ is the ammeter reading and N is the number of turns in the coil being employed, the formula for capacity becomes $$C = \frac{I_m \times 10^6}{2\pi N f E}$$

For an ammeter reading of 1 the resulting capacity becomes the multiplier to be applied to the coil of N turns to convert the ammeter reading to capacity in micro-farads.

On a power source of 110-volts at a frequency of 60 herts, employing a coil of four (4) turns and an ammeter reading of 1, the multiplier for that coil is established by substituting in the above formula for capacity as follows:

$$C = \frac{1 \times 10}{2\pi 4 \times 60 \times 110} = 6.03 = \text{multiplier}$$

This multiplier number is rounded to the nearest whole number for multipliers 1 or larger as the error introduced by such rounding is within the desired accuracy for this apparatus.

The apparatus illustrated is provided with coils having the turns indicated below resulting in the multipliers shown here and on FIGS. 1, 2 and 3:

| Turns      | 1  | 2  | 3 | 4 | 6 | 8 | 12 | 24 | 48 | 96  | 192  | 384  |
|------------|----|----|---|---|---|---|----|----|----|-----|------|------|
| Multiplier | 24 | 12 | 8 | 6 | 4 | 3 | 2  | 1  | .5 | .25 | .125 | .063 |

Other numbers of turns with corresponding multipliers may be used, as the need demands.

OPERATION

In the operation of my apparatus the tongs of the alternating current ammeter 60 are inserted through the toroid 38 thereby permitting a reading related to the current flow through the selected coil. The test lead clips 42a and 43a are connected to the capacitor 48 to be tested and power cable 40 is connected to a suitable power source. Testing is accomplished by first closing a switch 44 having a multiplier designation large enough to assure the current will not exceed the ammeter scale, such as 24 associated with button 44c, noting the ammeter reading and opening the switch by releasing the button 44c.

In the event the current flow is of such a low value that the ammeter is not readable, sequential progress is made to a switch having a smaller multiplier designation, such as 8, continuing with decreasing multipliers until a suitable reading is indicated on the ammeter 60, preferably near the center scale. For best results a digital reading ammeter is used.

The ammeter reading is then recorded together with the multiplier designated on the switch being used. The switch is then released and the switch designated "D" depressed to discharge the capacitor for safe handling. The micro-farad capacity is then obtained by multiplying the ammeter reading by the multiplier designating the switch selected for the test.

The accuracy of the resulting capacity is dependent upon the power supply voltage corresponding to the voltage used in determination of the multiplier. Normal variation in power supply voltage is acceptable in the capacity determination of commercial capacitors.

If desired, more accurate capacity determination may be obtained by measurement of the voltage at the capacitor terminals and adjusting the multiplier by the ratio of 110 volts to the measured voltage.

Having thus described my invention in preferred embodiments, I claim:

1. Capacitor testing apparatus comprising:
    (a) a pair of electrical conductors arranged for releasable connection to a source of alternating current,
    (b) a plurality of electric coils of differing numbers of turns forming a toroid permitting the removable insertion therethrough of a tong-type ammeter for measurement of current flow through said coils,
    (c) a pair of capacitor test leads arranged for releasable connection to a capacitor to be tested, and
    (d) an electric switch associated with each coil for releasably connecting said coil and said test leads in series to said pair of electric conductors for connection across a source of alternating current for measuring the capacitance of the test capacitor,
    (e) the capacitance, in microfarads, being related to the coils and the source of alternating current by the equation $$C = \frac{I_m \times 10^6}{2\pi N f E}$$

wherein $I_m$ is the ammeter reading in ampheres, N is the number of turns of the applied coil, f is the frequency in Hertz of the alternating current source, and E is the voltage of the alternating current source.

2. The apparatus of claim 1 including a normally opened discharge switch connected across the capacitor test leads for discharging a test capacitor after testing.

3. The apparatus of claim 2 wherein the discharge switch is connected across the capacitor test leads through one of the coils.

4. The apparatus of claim 2 wherein the discharge switch is connected across the capacitor test leads through a resistance.

5. The apparatus of claim 1 including a housing, the toroid projecting outwardly from the housing for access by a tong-type ammeter, and manual actuators for the plurality of switches, said actuators being exposed at the outer surface of the housing for manual manipulation.

6. The apparatus of claim 5 wherein each switch actuator is identified by a number designating the multiplier to be applied to the ammeter reading to determine the capacitance value.

7. Capacitor testing apparatus comprising:
(a) a pair of electrical conductors arranged for releasable connection to a source of alternating current,
(b) a plurality of electric coils of differing numbers of turns forming a toroid permitting the removable insertion therethrough of a tong-type ammeter for measurement of current flow through said coils,
(c) a pair of capacitor test leads arranged for releasable connection to a capacitor to be tested,
(d) an electric switch associated with each coil for releasably connecting said coil and said test leads in series to said pair of electric conductors for connection across a source of alternating current for measuring the capacitance of the test capacitor,
(e) the capacitance, in microfarads, being related to the coils and the source of alternating current by the equation $$C = \frac{I_m \times 10^6}{2\pi N f E}$$

wherein $I_m$ is the ammeter reading in amperes, N is the number of turns of the applied coil, f is the frequency in Hertz of the alternating current source, and E is the voltage of the alternating current source,
(f) a normally open discharge switch connected across the capacitor test leads for discharging a test capacitor after testing,
(g) a housing, the toroid projecting outwardly from the housing for access by a tong-type ammeter, and
(h) manual actuators for the plurality of switches, said actuators being exposed at the outer surface of the housing for manual manipulation,
(i) each switch actuator being identified by a number designating the multiplier to be applied to the ammeter reading to determine the capacitance value.

* * * * *